United States Patent
Keech et al.

(10) Patent No.: US 11,827,558 B2
(45) Date of Patent: Nov. 28, 2023

(54) COATED GLASS ARTICLES AND PROCESSES FOR PRODUCING THE SAME

(71) Applicant: Corning Incorporated, Corning, NY (US)

(72) Inventors: John Tyler Keech, Painted Post, NY (US); Jean-Francois Oudard, Webster, NY (US); Robert Sabia, Parkland, FL (US); Leena Kumari Sahoo, Corning, NY (US); Leonard Gerard Wamboldt, Sunderland, MA (US)

(73) Assignee: CORNING INCORPORATED, Corning, NY (US)

( * ) Notice: Subject to any disclaimer, the term of this patent is extended or adjusted under 35 U.S.C. 154(b) by 16 days.

(21) Appl. No.: 17/488,397

(22) Filed: Sep. 29, 2021

(65) Prior Publication Data
US 2022/0017408 A1  Jan. 20, 2022

Related U.S. Application Data

(62) Division of application No. 15/808,079, filed on Nov. 9, 2017, now Pat. No. 11,161,778.

(Continued)

(51) Int. Cl.
*G02B 1/115* (2015.01)
*C03C 17/34* (2006.01)
(Continued)

(52) U.S. Cl.
CPC ...... *C03C 17/3417* (2013.01); *C03C 17/3435* (2013.01); *C03C 23/0075* (2013.01);
(Continued)

(58) Field of Classification Search
CPC .............. G02B 1/115; C03C 2217/734; C03C 17/3417; C03C 2217/213; C03C 2217/218; C03C 2217/281; C03C 2218/156
See application file for complete search history.

(56) References Cited

U.S. PATENT DOCUMENTS

| 5,233,464 A | 8/1993 | Costich |
| 5,930,046 A | 7/1999 | Solberg et al. |

(Continued)

FOREIGN PATENT DOCUMENTS

WO  2014/055134 A1  4/2014

OTHER PUBLICATIONS

Richter et al. "Optical Properties and mechanical stress in SiO2/Nb2O5 multilayers" 2002, Thin Solid Films v. 389, pp. 278-283 (Year: 2001).*

(Continued)

*Primary Examiner* — Cara E Rakowski
(74) *Attorney, Agent, or Firm* — Yiqun Zhao

(57) ABSTRACT

According to one embodiment, a method for producing a coated glass article may include applying an anti-reflective coating onto a glass substrate. The glass substrate may include a first major surface, and a second major surface opposite the first major surface. The anti-reflective coating may be applied to the first major surface of the glass substrate. A substrate thickness may be measured between the first major surface and the second major surface. The glass substrate may have an aspect ratio of at least about 100:1. The coated glass article may have a reflectance of less than 2% for all wavelengths from 450 nanometers to 700 nanometers. The anti-reflective coating may include one or (Continued)

more layers. The cumulative layer stress of the anti-reflective coating may have an absolute value less than or equal to about 167,000 MPa nm.

13 Claims, 6 Drawing Sheets

Related U.S. Application Data

(60) Provisional application No. 62/449,698, filed on Jan. 24, 2017, provisional application No. 62/419,602, filed on Nov. 9, 2016.

(51) Int. Cl.
*C03C 23/00* (2006.01)
*H01J 37/32* (2006.01)
*C23C 14/50* (2006.01)

(52) U.S. Cl.
CPC ............ *C23C 14/50* (2013.01); *G02B 1/115* (2013.01); *H01J 37/32715* (2013.01); *C03C 2217/213* (2013.01); *C03C 2217/218* (2013.01); *C03C 2217/281* (2013.01); *C03C 2217/734* (2013.01); *C03C 2218/156* (2013.01); *C03C 2218/365* (2013.01)

(56) References Cited

U.S. PATENT DOCUMENTS

| | | |
|---|---|---|
| 5,944,964 A | 8/1999 | Solberg et al. |
| 2004/0205998 A1 | 10/2004 | Wakao et al. |
| 2006/0087739 A1 | 4/2006 | Ockenfuss et al. |
| 2007/0031633 A1 | 2/2007 | Satoh et al. |
| 2008/0049431 A1 | 2/2008 | Boek et al. |
| 2012/0134025 A1 | 5/2012 | Hart |
| 2012/0154916 A1* | 6/2012 | Nishimoto ............ G02B 1/115 359/580 |
| 2012/0196133 A1* | 8/2012 | Broadway ............ G02B 1/115 428/428 |
| 2014/0335332 A1 | 11/2014 | Bellman et al. |
| 2015/0015959 A1 | 1/2015 | Lee et al. |
| 2015/0338552 A1* | 11/2015 | Fujii .................... G02B 1/115 359/601 |
| 2017/0176654 A1 | 6/2017 | Sawyer et al. |
| 2017/0197384 A1 | 7/2017 | Finkeldey et al. |
| 2018/0100957 A1* | 4/2018 | Ye .......................... G02B 1/118 |
| 2018/0136380 A1* | 5/2018 | Tatemura ............... G02B 1/115 |
| 2018/0162771 A1* | 6/2018 | Fujii ....................... C03C 17/42 |

OTHER PUBLICATIONS

Bhatt and Chandra, "Silicon dioxide films by RF sputtering for microelectronic and MEMS applications," J. Micromech. Microeng. 17 (2007) 1066-1077.

International Search Report and Written Opinion PCT/US2017/060772 dated Jan. 4, 2018.

* cited by examiner

COATED GLASS ARTICLES AND PROCESSES FOR PRODUCING THE SAME

This application is a divisional of U.S. application Ser. No. 15/808,079, filed Nov. 9, 2017, which claims the benefit of priority under 35 U.S.C. § 119 of U.S. Provisional Application Ser. Nos. 62/419,602, filed on Nov. 9, 2016, and 62/449,698 filed on Jan. 24, 2017, the contents of each which are relied upon and incorporated herein by reference in their entirety.

TECHNICAL FIELD

The present specification relates to the application of coatings on glass substrates. More particularly, this specification relates to applying anti-reflective ("AR") coatings on glass substrates.

BACKGROUND

There is a market demand for high aspect ratio glass substrates. For example, such high aspect ratio glass substrates may be utilized in consumer electronics. Some of these high aspect ratio glass substrates may utilize an anti-reflective coating. These coated glass substrates should be relatively flat. Accordingly, there is a need for methods of applying anti-reflective coatings while maintaining the flat shape of a glass substrate.

SUMMARY

According to an embodiment, a method for producing a coated glass article may comprise applying an anti-reflective coating onto a glass substrate. The glass substrate may comprise a first major surface, and a second major surface opposite the first major surface. The anti-reflective coating may be applied to the first major surface of the glass substrate. A substrate thickness may be measured between the first major surface and the second major surface. The glass substrate may have an aspect ratio of at least about 100:1. The coated glass article may have a reflectance of less than 2% for all wavelengths from 450 nanometers to 700 nanometers when viewed on the first major surface at an angle of incidence of less than or equal to 10°. The anti-reflective coating may comprise one or more layers. The one or more layers of the anti-reflective coating may comprise a layer thickness and may comprise a film stress. The cumulative layer stress of the anti-reflective coating may have an absolute value less than or equal to about 167,000 MPa nm. The cumulative layer stress may be defined as $\Sigma_{i=1}^{n}(\alpha_i \times t_i)$ for an anti-reflective coating comprising n layers.

According to another embodiment, a method for producing a coated glass article may comprise applying a first coating onto a glass substrate to form an intermediate coated glass substrate. The glass substrate may comprise a first major surface, and a second major surface opposite the first major surface. The first coating may be applied to the first major surface of the glass substrate. A substrate thickness may be measured between the first major surface and the second major surface. The glass substrate may have an aspect ratio of at least about 100:1. The intermediate coated glass substrate may have a warp of at least about 150 microns subsequent to the application of the first coating. The method may further comprise applying a second coating onto the second major surface of the glass substrate to form the coated glass article. The coated glass article may have a warp of less than or equal to about 150 microns after the application of the second coating. At least one of the first coating and the second coating may be an anti-reflective coating. The coated glass article may have a reflectance of less than 2% for all wavelengths from 450 nanometers to 700 nanometers when viewed on the first major surface at an angle of incidence of less than or equal to 10°.

According to another embodiment, a coated glass article may comprise a glass substrate and an anti-reflective coating. The glass substrate may comprise a first major surface, and a second major surface opposite the first major surface. A substrate thickness may be measured between the first major surface and the second major surface. The glass substrate may have an aspect ratio of at least about 100:1. The anti-reflective coating may comprise one or more layers. The one or more layers of the anti-reflective coating may comprise a layer thickness and may comprise a film stress. The cumulative layer stress of the anti-reflective coating may have an absolute value less than or equal to about 167,000 MPa nm. The cumulative layer stress may be defined as $\Sigma_{i=1}^{n}(\alpha_i \times t_i)$ for an anti-reflective coating comprising n layers. The coated glass article may have a reflectance of less than 2% for all wavelengths from 450 nanometers to 700 nanometers when viewed on the first major surface at an angle of incidence of less than or equal to 10°. The coated glass article may have a bow of from about −100 microns to about 100 microns.

These and additional features provided by the embodiments described herein will be more fully understood in view of the following detailed description in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

According to various embodiments, a process for producing a coated glass article may comprise applying an anti-reflective coating onto a glass substrate, wherein the anti-reflective coating comprises one or more layers. The anti-reflective ("AR") coating may have a cumulative layer stress with an absolute value less than or equal to about 167,000 MPa nm. It has been found that utilizing a coating with a cumulative layer stress with a relatively low absolute value, in some embodiments, may not cause the glass substrate to form an increased bow and/or warp upon application. In additional embodiments, an AR coating may have a cumulative layer stress which forms or changes the bow and/or warp of the glass substrate when applied. For example, the warp of a glass substrate may be reduced when a coating is applied.

Figure 1:
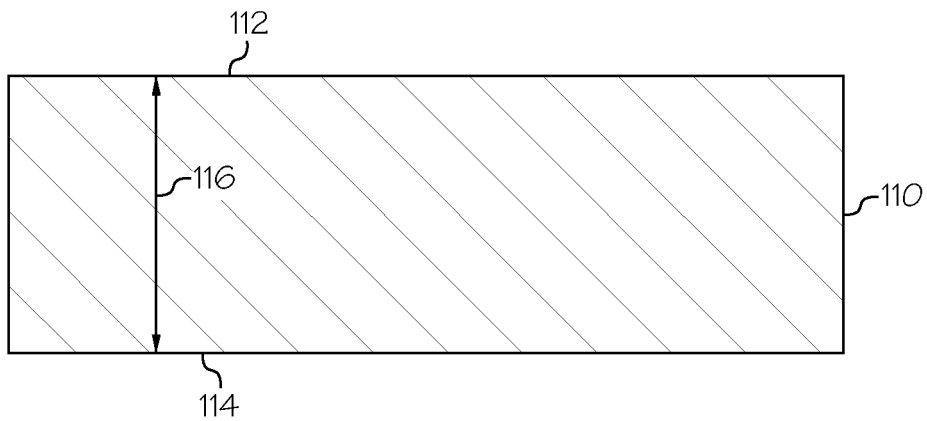
FIG. 1 schematically depicts a cross-sectional side view of a glass substrate, according to one or more embodiments described herein.

One or more embodiments of the methods described herein may utilize a glass substrate 110 as shown in FIG. 1. The glass substrate has a first major surface 112 and a second major surface 114. The first major surface 112 may be opposite the second major surface 114, such as to define a sheet. Together, the first major surface 112 and the second major surface 114 define the substrate thickness 116. As used herein, the substrate thickness 116 refers to the average distance between the first major surface 112 and the second major surface 114 as measured generally perpendicular to the first major surface 112 and/or the second major surface 114.

In one or more embodiments, the glass substrate 110 may comprise, consist, or consist essentially of a variety of glass materials with different compositions. For some embodiments, thin glass substrates are utilized. According to one or more embodiments, the glass substrate 110 may have a substrate thickness 116 of less than or equal to about 1 mm. According to additional embodiments, the glass substrate 110 may have a substrate thickness 116 of less than or equal to about 0.9 mm, less than or equal to about 0.8 mm, less than or equal to about 0.7 mm, less than or equal to about 0.6 mm, less than or equal to about 0.5 mm, less than or equal to about 0.4 mm, less than or equal to about 0.3 mm, less than or equal to about 0.2 mm, or even less than or equal to about 0.1 mm.

The glass substrate 110 may comprise a length in a direction generally orthogonal to its thickness. As used herein, the "length" of the glass substrate 110 refers to the maximum distance in a straight line across one of the first major surface 112 or second major surface 114. For example, a wafer shaped glass substrate 110 would have a length equal to its diameter. For example, in some embodiments, the diameter of the wafer can be 150 mm or greater (e.g., 200 mm, 300 mm, 400 mm, 450 mm, 500 mm, 600 mm, or even 700 mm). According to one or more embodiments, the length of the glass substrate 110 is greater than or equal to about 300 mm. According to additional embodiments, the length of the glass substrate 110 may be greater than or equal to 275 mm, greater than or equal to 250 mm, greater than or equal to 225 mm, greater than or equal to 200 mm, greater than or equal to 175 mm, or even greater than or equal to 150 mm. For example, in some exemplary embodiments, the length of the glass substrate 110 may be 150 mm to 600 mm. According to some embodiments the glass substrate has a rectangular surface, for example 400 mm wide by 500 mm long, or 150 mm by 150 mm, 200 mm by 200 mm, 300 mm by 300 mm, 400 mm by 400 mm, or 500 mm by 500 mm.

The aspect ratio of the glass substrate 110 is defined as the ratio of the length of the glass substrate to the substrate thickness 116. The aspect ratio is expressed herein as two numbers separated by a colon (e.g. 150:1). The numbers in the aspect ratio do not necessarily represent the actual value of the length of the glass substrate 110 or the substrate thickness 116. Rather, they represent the relationship between the length of the glass substrate 110 and the substrate thickness 116. For example, a glass substrate 110 with a length of 300 mm and a substrate thickness 116 of 0.2 mm would have an aspect ratio expressed as 1500:1.

According to one or more embodiments, the glass substrate 110 may have an aspect ratio of at least about 100:1. According to additional embodiments the glass substrate 110 may have an aspect ratio of at least about 150:1, an aspect ratio of at least about 200:1, an aspect ratio of at least about 250:1, an aspect ratio of at least about 300:1, an aspect ratio of at least about 350:1, an aspect ratio of at least about 450:1, an aspect ratio of at least about 500:1, an aspect ratio of at least about 550:1, an aspect ratio of at least about 600:1, an aspect ratio of at least about 650:1, an aspect ratio of at least about 700:1, an aspect ratio of at least about 750:1, an aspect ratio of at least about 800:1, an aspect ratio of at least about 900:1, an aspect ratio of at least about 1000:1, an aspect ratio of at least about 1100:1, an aspect ratio of at least about 1200:1, an aspect ratio of at least about 1300:1, an aspect ratio of at least about 1400:1, or even an aspect ratio of at least about 1500:1.

According to one or more embodiments, the glass substrate 110 may have a refractive index of from about 1.5 to about 2.1. The refractive index of a material describes the speed at which light propagates through the material. It is defined by Eq. (1)

$$n = \frac{c}{v}$$ Eq. (1)

where n is the refractive index of a given material, c is the speed of light in a vacuum, and v is the phase velocity of light in the given material. As used herein, the "refractive index" is based on light with a wavelength of 589 nm. According to additional embodiments, the glass substrate 110 has a refractive index from about 1.5 to about 2.0, a refractive index from about 1.55 to 2, a refractive index from about 1.56 to about 2, 1.57 to 2, a refractive index from about 1.6 to about 2.0, a refractive index from about 1.7 to about 1.9, a refractive index from about 1.5 to about 1.7, a refractive index from about 1.5 to about 1.9, a refractive index from about 1.7 to about 2.1, or a refractive index from about 1.6 to about 1.8.

According to one or more embodiments, prior to the application of the AR coating 120, the glass substrate 110 may have a relatively small bow and/or warp. As described by ASTM F534, "bow" refers to the deviation of the center point of the median surface to a reference plane. Additionally, as described by ASTM F1390, "warp" refers to the difference between the maximum and minimum distances of the median surface from the reference plane.

According to one or more embodiments, the glass substrate 110 prior to application of the AR coating 120 may have a bow from about −20 microns to about 20 microns. In additional embodiments, the glass substrate 110 prior to application of the AR coating 120 may have a bow from about −15 microns to about 15 microns, from about −10 microns to about 10 microns, from about −5 microns to about 5 microns, or even from about −3 microns to about 3 microns.

According to one or more embodiments, the glass substrate 110 prior to application of the AR coating 120 may have a warp of less than or equal to about 40 microns. In additional embodiments, the glass substrate 110 prior to application of the AR coating 120 may have a warp less than or equal to about 30 microns, less than or equal to about 25 microns, less than or equal to about 20 microns, less than or equal to about 15 microns, or even less than or equal to about 10 microns.

According to one or more embodiments, an AR coating 120 may be applied to one or more of the first major surface 112 or the second major surface 114. As used herein, the term "applying" includes depositing, coating, and/or forming a material onto a surface using any known or to be developed method in the art. Depositing may include vacuum deposition techniques such as, for example, chemical vapor deposition, plasma enhanced chemical vapor deposition, low-pressure chemical vapor deposition, atmospheric pressure chemical vapor deposition, plasma enhanced atmospheric pressure chemical vapor deposition, physical vapor deposition, reactive sputtering, nonreactive sputtering, laser ablation, thermal or e-beam evaporation, atomic layer deposition. Reactive sputtering includes, for example, reactive magnetron sputtering with standard DC power or magnetron sputtering with pulsed DC power. Coating may include liquid based methods such as, for example, spraying, dipping, spin coating, slot coating, or sol-gel methods.

Figure 2:
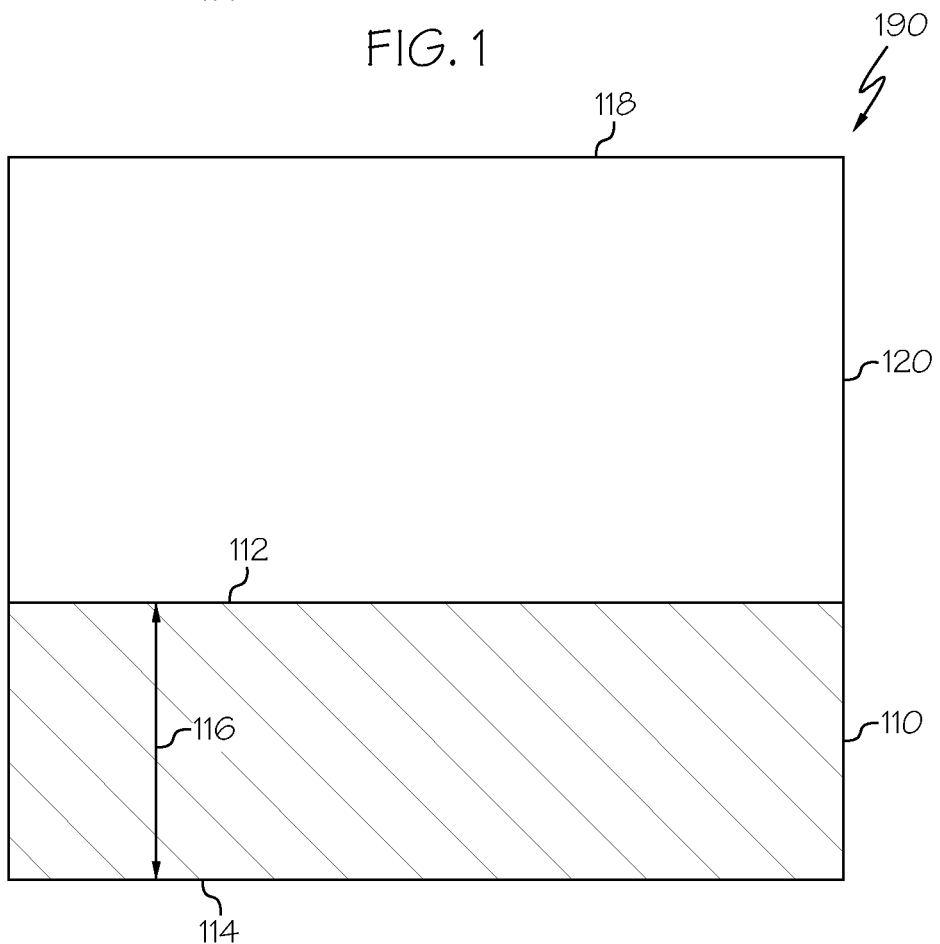
FIG. 2 schematically depicts a cross-sectional side view of a coated glass article, according to one or more embodiments described herein.

FIG. 2 depicts a coated glass article 190 including a glass substrate 110 having an AR coating 120 on its first major surface 112. The AR coating 120 may comprise an air-side surface 118 and may be in contact with the first major surface 112 of the glass substrate 110. As used herein, the term "contact" can mean either direct contact or indirect contact. Direct contact refers to contact in the absence of intervening material and indirect contact refers to contact through one or more intervening materials. Elements in direct contact touch each other. Elements in indirect contact do not touch each other, but do touch an intervening material or series of intervening materials, where the intervening material or at least one of the series of intervening materials touches the other. Elements in contact may be rigidly or non-rigidly joined. Contacting refers to placing two elements in direct or indirect contact. Elements in direct contact may be said to directly contact each other. Elements in indirect contact may be said to indirectly contact each other. It should be understood that when two elements are "in contact" with one another, in some embodiments, they are in direct contact with one another.

As used herein, an AR coating 120 refers to a coating that has relatively low reflectance (i.e., high transmission). In one or more embodiments, the coated glass article 190 may have a reflectance of less than or equal to about 0.2% over all wavelengths from 450 nm to 700 nm when viewed on a surface comprising an AR coating 120 at an angle of incidence of less than or equal to about 10°. Reflectance is a property of a surface that describes the relative amount of light reflected by the surface. Reflectance is defined as the intensity of light reflected divided by the intensity of the incident light and may be expressed as a percentage. Reflectance may vary for a given material based on the wavelength of incident light and the angle of incidence. Reflectance may be measured over a range of wavelengths of visible light (i.e. 450 nm to 700 nm). Unless otherwise mentioned, reflectance as referenced herein is measured at an angle of incidence less than or equal to about 10°.

According to additional embodiments, the coated glass article 190 exhibits a reflectance of less than or equal to about 2.0%, a reflectance of less than or equal to about 1.5%, a reflectance of less than or equal to about 1.0%, a reflectance of less than or equal to about 0.8%, a reflectance of less than or equal to about 0.6%, a reflectance of less than or equal to about 0.5%, a reflectance of less than or equal to about 0.4%, or even a reflectance of less than or equal to about 0.3%.

The AR coating 120 may comprise materials such as, without limitation, $SiO_2$, $Al_2O_3$, $GeO_2$, $SiO$, $AlO_xN_y$, $AlN$, $SiNx$, $SiO_xN_y$, $Si_uAl_vO_xN_y$, $Ta_2O_5$, $Nb_2O_5$, $TiO_2$, $ZrO_2$, $TiN$, $MgO$, $MgF_2$, $BaF_2$, $CaF_2$, $SnO_2$, $HfO_2$, $Y_2O_3$, $MoO_3$, $DyF_3$, $YbF_3$, $YbF_xO_y$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, or other materials known or to be discovered in the art.

Figure 3:
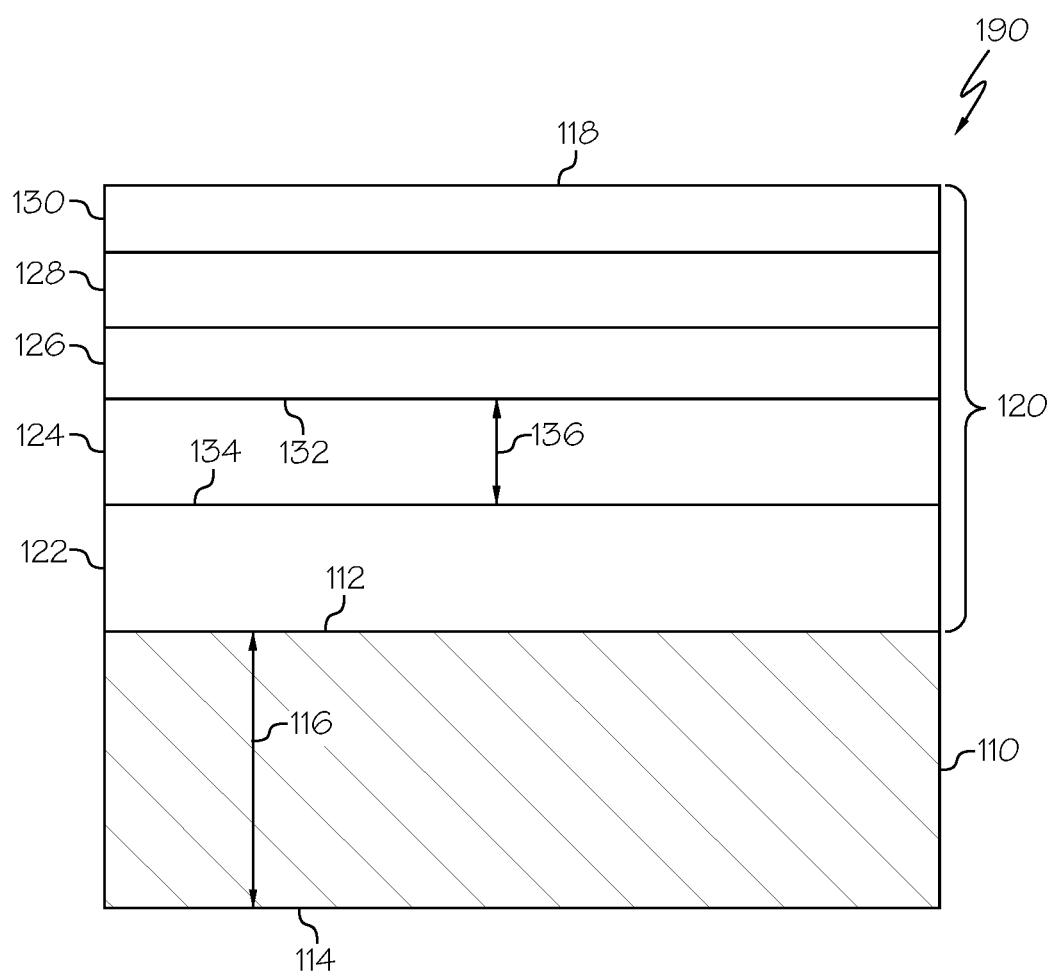
FIG. 3 schematically depicts a cross-sectional side view of a coated glass article comprising multiple layers, according to one or more embodiments described herein.

The AR coating 120 of one or more embodiments may comprise multiple layers. One of such embodiments is depicted in FIG. 3. The layers 122, 124, 126, 128, and 130 of the AR coating 120 may be in contact with the first major surface 112 of the glass substrate 110 and/or in contact with another layer. In one or more embodiments, only one layer is in contact with the first major surface 112 of the glass substrate 110. In one or more embodiments, each layer is applied in such a manner that no layer is in contact with more than two other layers. Each layer may comprise a lower layer surface 134, an upper layer surface 132, and a layer thickness (t) between the lower layer surface 134 and the upper layer surface 132. The upper layer surface 132 is the surface formed at the direct contact of the layer and another layer, the glass substrate 110, air, or other medium. The lower layer surface 134 may be opposite the upper layer surface 132 and is the surface formed at the direct contact of the layer and another layer, the glass substrate 110, air, or other medium. A layer in contact with the air may comprise an air-side surface 118. The layer thickness (t) is defined as the average distance between the upper layer surface 132 and the lower layer surface 134 measured generally perpendicular to a layer surface. For example, referring to one embodiment shown in FIG. 3, layer 124 of AR coating 120 has a layer thickness 136 depicted.

As used herein, the terms "upper" and "lower" are relative terms only, are indicative of a general relative orientation only, and do not necessarily indicate absolute location. These terms also may be used for convenience to refer to orientations used in the figures, which orientations are used as a matter of convention only and are not intended as characteristic of the processes and elements shown. The present specification and the embodiments thereof to be described herein may be used in any desired orientation.

In one or more embodiments, each layer of the anti-reflective coating has a layer thickness from about 1.5 nm to about 150 nm. In other embodiments, each layer of the anti-reflective coating has a layer thickness from about 1.5 nm to about 140 nm, from about 1.5 nm to about 130 nm, from about 1.5 nm, to about 120 nm, from about 1.5 nm to about 110 nm, from about 1.5 nm to about 100 nm, from about 1.5 nm to about 90 nm, from about 1.5 nm to about 80 nm, from about 1.5 nm to about 70 nm, from about 1.5 nm to about 80 nm, from about 1.5 nm to about 70 nm, from about 1.5 nm to about 60 nm, from about 1.5 nm to about 50 nm, from about 5 nm to about 50 nm, from about 5 nm to about 60 nm, from about 5 nm to about 70 nm, from about 5 nm to about 80 nm, from about 5 nm to about 90 nm, or even from about 5 nm to about 100 nm. For example, one or more of a first layer, a second layer, a third layer, a fourth layer, etc., may have a thickness of from about 1.5 nm to about 150 nm.

In one or more embodiments, the one or more layers 122, 124, 126, 128, 130 of the AR coating 120 may have different refractive indices. The refractive index of each layer is consistent with the definition of refractive index described herein. In some embodiments, varying the refractive indices of each AR coating layer may achieve the anti-reflective properties desired. For example, alternating layers of high refractive index and low refractive index materials at particular thicknesses may form an AR coating.

In one or more embodiments, one or more layers of the AR coating 120 may have refractive indices from about 1.4 to about 1.6. In other embodiments, one or more layers of the AR coating 120 may have refractive indices from about 1.6 to 1.8, from about 1.8 to 2.0, from about 1.9 to about 2.1, from about 2.1 to about 2.3, from about 2.2 to about 2.4, or even from about 2.4 to about 2.6.

In one or more embodiments, the AR coating 120 may comprise from 4 to 18 layers. In other embodiments, the AR coating 120 may comprise from 5 to 18 layers, from 6 to 18 layers, from 5 to 16 layers, from 6 to 16 layers, from 4 to 6 layers, from 14 to 18 layers, or even from 5 to 12 layers.

According to one or more embodiments, the anti-reflective coating may be applied by successively applying coating layers. For example, applying the anti-reflective coating may comprise depositing a first layer of the anti-reflective coating onto the first major surface of the glass substrate, and depositing a second layer of the anti-reflective coating onto the first layer. Successive coating layers may be deposited on top of other layers, such as a third layer over the second layer, and a fourth layer over the third layer.

In one or more embodiments, the coated glass article 190 may be relatively flat after the AR coating 120 is applied. In one or more embodiments, the coated glass article 190 may have a bow from about −100 microns to about 100 microns. In other embodiments, the coated glass article 190 may have a bow from about −90 microns to about 90 microns, from about −80 microns to about 80 microns, from about −70 microns to about 70 microns, from about −60 microns to about 60 microns, from about −50 microns to about 50 microns, from about −40 microns to about 40 microns, from about −30 microns to about 30 microns, or even from about −20 microns to about 20 microns.

In one or more embodiments the coated glass article 190 may have a warp of less than or equal to about 150 microns. In other embodiments, the coated glass article 190 may have a warp less than or equal to 125 microns, less than or equal to 100 microns, less than or equal to 90 microns, less than or equal to 80 microns, less than or equal to 70 microns, less than or equal to 60 microns, less than or equal to 50 microns, less than or equal to 40 microns, less than or equal to 30 microns, less than or equal to 20 microns, or even less than or equal to 10 microns.

Coatings, such as AR coating 120, on a glass substrate 110 may have residual internal stresses that develop from the manufacture or subsequent machining of the coated glass article 190. For example, the application of a coating itself can be a source of internal stress for coated glass articles 190. Materials used for coatings differ from the substrate materials and result in mismatches within the lattice and differences in thermal expansion characteristics. These mismatches and differences can cause stress to develop within the coated glass article 190. Coating materials are often applied to the glass substrate 110 as a thin film at elevated temperatures. Differences in the coefficient of thermal expansion (CTE) between the coating and the substrate create stresses upon cooling of the coated glass article 190 from application temperature.

Stresses in coatings may cause warp and/or bow to increase in a coated glass article 190. These stresses can cause distortion of the glass substrates 110 and inhibit their performance for some end-uses. Large aspect ratio glass substrates 110 are particularly problematic because their surfaces become more sensitive to increased bow and/or warp caused by residual stresses in the coatings.

In one or more embodiments, the one or more layers of the AR coating 120 further comprise a film stress ($\alpha$). The film stress of a layer is characteristic of stresses within the layer as a result of inherent material properties and differences in thermal expansion characteristics. The film stress may be either compressive or tensile in nature. The tensile versus compressive nature of the film stress may be referred to herein as the stress state of the layer. A layer in tension manifests a tensile stress and is a tensile layer. A layer in compression manifests a compressive stress and is a compressive layer. A film stress having a positive sign may be referred to as tensile and a film stress having a negative sign may be referred to as compressive. Film stress ($\alpha$) of any layer is further defined by Eq. (2)

$$\alpha = \frac{1}{6}\left(\frac{1}{R_{post}} - \frac{1}{R_{pre}}\right)\left(\frac{1}{E_s(1-v_s)(t_s/t_f)}\right) \quad \text{Eq. (2)}$$

where $R_{post}$ is the glass substrate's radius of curvature after the layer is applied, $R_{pre}$ is the glass substrate's radius of curvature before the layer is applied, $E_s$ is Young's modulus for the glass substrate, $v_s$ is Poison's ratio for the glass substrate, $t_s$ is the substrate thickness, and $t_f$ is the layer thickness.

Apart from stresses formed from differing thermal expansion characteristics, other stresses may result from the application of the coating to the glass substrate 110 and subsequent processing. Densification of coatings, for example, may be desired and effected by plasma-assisted or ion bombardment techniques. Exposure of the coated glass article 190 to plasma or energetic ions can create stresses in the coated glass article 190. The presence of such stresses in the coated glass article 190 can lead to distortions in the shape of a surface of the coated glass article.

One strategy to minimize the effect of internal stresses on the shape of the coated glass article 190 can be to choose coating materials with low internal stresses when applied. Although it may be possible to form coatings out of materials having low internal stresses, the reduction in stress is often accompanied by structural relaxations that alter the structure of the coating in a manner that impairs its performance. For example, coatings with high porosity often have lower stresses. However, porous coatings exhibit reflectivity in the visible and near-ultraviolet range. Additionally, efforts to reduce stresses in individual layers may also induce structural changes in the coated glass article 190 that produce defects in the performance of the coated glass article 190 or the compatibility of the coating and the glass substrate 110.

However, it has been discovered that another strategy to minimize the effect of internal stresses on the shape of a coated glass article 190 can be to strategically apply the layers of the AR coating 120 in such a manner that their film stresses partially negate each other resulting in a lower cumulative layer stress for the coated glass article 190 as a whole. The cumulative layer stress of a coated glass article 190 with n layers may be described by Eq. (3)

$$\text{cumulative layer stress} = \Sigma_{i=1}^{n}(\alpha_i \times t_i) \qquad \text{Eq. (3)}$$

where α is the film stress of an individual layer and t is the thickness of that layer for n layers in the AR coating 120. A strategy of minimizing the effect of internal stresses on the shape of a coated glass article 190 can be achieved by minimizing the cumulative layer stress.

In one or more embodiments, the cumulative layer stress of the AR coating 120 has an absolute value less than or equal to about 167,000 MPa nm. In other embodiments, the cumulative layer stress of the anti-reflective coating has an absolute value less than or equal to about 125,000 MPa nm, less than or equal to about 100,000 MPa nm, less than or equal to about 75,000 MPa nm, less than or equal to about 50,000 MPa nm, less than or equal to about 25,000 MPa nm, less than or equal to about 15,000 MPa nm, less than or equal to about 8,000 MPa nm, or even less than or equal to about 1,000 MPa nm. In other embodiments, the cumulative layer stress of the anti-reflective coating has an absolute value from about 1,000 MPa nm to about 167,000 MPa nm, from about 1,000 MPa nm to about 125,000 MPa nm, from about 1,000 MPa nm to about 100,000 MPa nm, from about 1,000 MPa nm to about 75,000 MPa nm, from about 1,000 MPa nm to about 50,000 MPa nm, from about 15,000 MPa nm to about 167,000 MPa nm, from about 15,000 MPa nm to about 125,000 MPa nm, from about 15,000 MPa nm to about 100,000 MPa nm, from about 15,000 MPa nm to about 75,000 MPa nm, from about 15,000 MPa nm to about 50,000 MPa nm, from about 15,000 MPa nm to about 25,000 MPa nm, from about 25,000 MPa nm to about 167,000 MPa nm, from about 25,000 MPa nm to about 125,000 MPa nm, from about 25,000 MPa nm to about 100,000 MPa nm, from about 25,000 MPa nm to about 75,000 MPa nm, or even from about 25,000 MPa nm to about 50,000 MPa nm.

As described by equation (3), the cumulative stress is a function of the stress in each layer as well as the thickness of each layer. Therefore, the absolute value of the cumulative layer stress may be minimized by controlling the layer thickness as well as the stress of each layer.

Control of stress in each layer may be achieved by several methods. For example, stresses caused by differences in thermal expansion characteristics between an AR coating 120 and a glass substrate 110 are increased when the coated glass article 190 undergoes an extended range of temperature change. For example, the stress caused by uneven thermal expansion characteristics when a coated glass article 190 cools down from a 200° C. application temperature to room temperature is greater than the stress caused by uneven thermal expansion characteristics when a coated glass article 190 cools down from a 150° C. application temperature to room temperature. Therefore, in one or more embodiments, stresses on a coated glass article 190 can be controlled by adjusting the application temperature of the AR coating 120.

Other methods of controlling the stresses on the shape of a coated glass article may involve selection of coating materials with CTEs similar to the substrate. Matching CIEs between the coating and the substrate reduces stress and allows for higher application temperatures. Alternatively, the stoichiometry of certain coating layers can be altered to fine tune the film stress associated with that layer. For example, compounds like $SiN_xO_y$ and $YbF_xO_y$ can be produced from $Si_3N_4$ and $YbF_3$ (respectively) for a range of values x and y, each with a different associated film stress.

Another method of minimizing the effect of internal stresses on the shape of a coated glass article 190 is to adjust the pressure at which a coating is applied. Changing the pressure of coating application changes the film density and as a result, changes the film stress of that coating layer. In one or more embodiments, the pressure of a coating application can be adjusted by altering the fluid flow or altering pumping speed during application.

In one or more embodiments, it may be desirable to have a smooth surface after the application of the AR coating so as to not disrupt the optical properties of the coated glass article 190. Rough surfaces increase light scattering and reflectivity in the visible light range. In one or more embodiments, rough surfaces can decrease intensity and contrast when the coated glass article 190 is utilized in imaging systems. In at least one embodiment, an air-side surface 118 may have a surface roughness ($R_a$) of less than or equal to about 2 nm. Surface roughness ($R_a$) may be characterized by Eq. (4)

$$R_a = \frac{1}{n}\sum_{i=1}^{n}|y_i| \qquad \text{Eq. (4)}$$

where y represents the value of a measured height and n represents the number of measurements taken. In other embodiments, an air-side surface 118 may have a surface roughness ($R_a$) of less than or equal to about 1.5 nm, less than or equal to about 1.0 nm, or even less than or equal to 0.5 nm.

In one or more embodiments, surface roughness can be minimized by strategically altering the placement and thickness of AR coating layers. In some such embodiments, each layer is kept below 150 nm and the total thickness of the AR coating 120 does not exceed 300 nm. In other embodiments, the material with the highest associated surface roughness ($R_a$) is applied especially thin. In other embodiments, the layer comprising the air-side surface 118 is applied relatively thick.

Similarly, in one or more embodiments, it may be desirable to have an AR coating 120 evenly applied as to not disrupt the optical properties of the coated glass article 190. In at least one embodiment, the coated glass article 190 has a total thickness variation (TTV) of less than or equal to about 2 microns. As defined in ASTM F657, the TTV is the difference between the maximum and minimum values of thickness encountered during a scan pattern or series of point measurements. In other embodiments, the coated glass article 190 has a TTV of less than or equal to about 5 microns, less than or equal to about 4 microns, or even less than or equal to about 3 microns.

Figure 4:
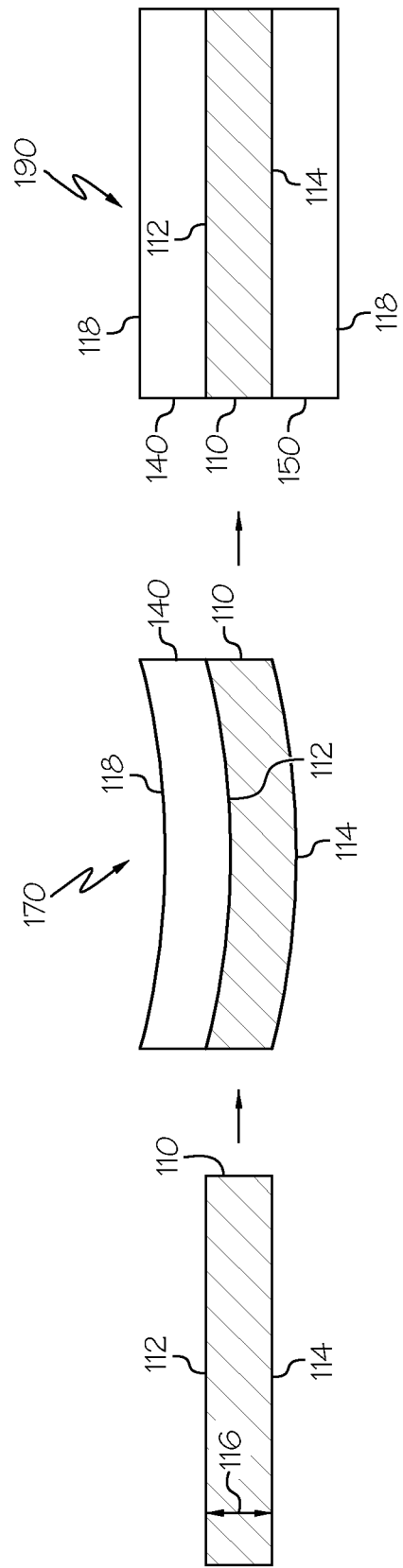
FIG. 4 schematically depicts a method to produce a coated glass article, according to one or more embodiments descried herein.

FIG. 4 depicts another embodiment, in which a first coating 140 is applied to a relatively flat glass substrate 110, producing an intermediate coated glass substrate 170 which has an increased bow and/or warp. Subsequent to the application of a first coating 140, a second coating 150 is applied to the intermediate coated glass substrate 170, producing a coated glass article 190 with reduced bow and/or warp. As depicted in FIG. 4, another strategy to minimize the effects of internal stresses on the shape of the glass substrate 110 can be to apply coating layers on a major surface opposite the AR layer to minimize the cumulative layer stress for the coated glass article 190.

Referring to FIG. 4, one or more embodiments may begin with a relatively flat glass substrate 110 that is distorted by the application of a first coating 140. In these embodiments, the resulting intermediate coated glass substrate 170 may have an increased bow and/or warp. The intermediate coated glass substrate 170 may then be correctively returned to a relatively flat state by the application of a second coating 150, producing a coated glass article 190. In some of these embodiments, the first coating 140, the second coating 150, or both, may be AR coatings.

Still referring to FIG. 4, in one or more embodiments, subsequent to the application of the first coating 140, but prior the application of the second coating 150, the intermediate coated glass substrate 170 may have a bow greater than or equal to 150 microns or less than or equal −150 microns. In other embodiments, the intermediate coated glass substrate 170 may have a bow greater than or equal to 200 microns or less than or equal −200 microns, greater than or equal to 300 microns or less than or equal −300 microns, greater than or equal to 400 microns or less than or equal −400 microns, or even greater than or equal to 500 microns or less than or equal −500 microns.

In one or more embodiments, subsequent to the application of the first coating 140, but prior the application of the second coating 150, the intermediate coated glass substrate 170 may have a warp of at least about 150 microns. In other embodiments, the intermediate coated glass substrate 170 may have a warp of at least about 200 microns, at least about 300 microns, at least about 400 microns, or even at least about 500 microns.

In order to produce a relatively flat the coated glass article 190, the stresses of the first coating 140 and the second coating 150 may be balanced (e.g., the cumulative layer stress of the first coating 140 is about equal to the cumulative layer stress of the second coating 150). In one or more embodiments, the difference between the absolute values of the cumulative layer stresses of the first coating 140 and the second coating 150 is less than or equal to about 167,000 MPa nm. The cumulative layer stress of the coatings present in these embodiments can be characterized by Eq. (3). In such embodiments, the cumulative layer stress of the first coating 140 and the second coating 150 are calculated independently by Eq. (3). The difference of the absolute values of these two cumulative layer stresses may then be calculated. In additional embodiments, the difference between absolute values of the cumulative layer stresses of the first coating 140 and the second coating 150 may be less than or equal to about 125,000 MPa nm, less than or equal to about 100,000 MPa nm, less than or equal to about 75,000 MPa nm, less than or equal to about 50,000 MPa nm, or even less than or equal to about 25,000 MPa nm.

In some embodiments, the coated glass article 190 may be still relatively flat after the second coating 150 is applied. In one or more embodiments, following the process of FIG. 4, the coated glass article 190 may have a bow from about −100 microns to about 100 microns. In other embodiments, the coated glass article 190 may have a bow from about −90 microns to about 90 microns, from about −80 microns to about 80 microns, from about −70 microns to about 70 microns, from about −60 microns to about 60 microns, from about −50 microns to about 50 microns, from about −40 microns to about 40 microns, from about −30 microns to about 30 microns, or even from about −20 microns to about 20 microns.

In one or more embodiments, following the process of FIG. 4, the coated glass article 190 may have a warp of less than or equal to about 150 microns. In other embodiments, the coated glass article 190 may have a warp less than or equal to 125 microns, less than or equal to 100 microns, less than or equal to 90 microns, less than or equal to 80 microns, less than or equal to 70 microns, less than or equal to 60 microns, less than or equal to 50 microns, less than or equal to 40 microns, less than or equal to 30 microns, less than or equal to 20 microns, or even less than or equal to 10 microns. In some embodiments, the coated glass article 190 may have a warp of 1 to 150 microns, for example 1-50 microns, 1-30 microns, 1-20 microns, or 1-10 microns.

Figure 5:
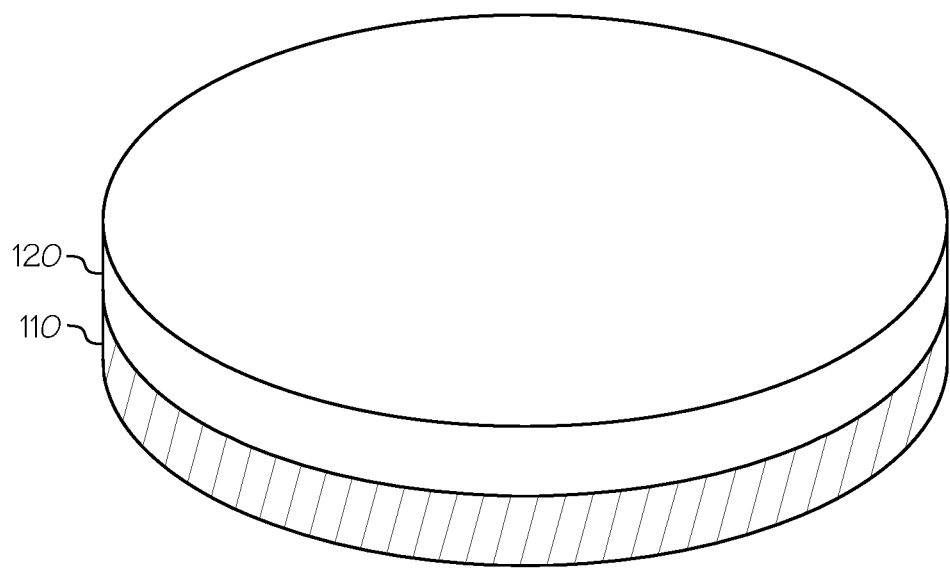
FIG. 5 depicts a perspective view of a wafer shaped coated glass article, according to one or more embodiments described herein.

Referring to FIG. 5, in one or more embodiments, the glass substrate 110 and resulting coated glass article 190 may be wafer shaped (i.e., in these embodiments the glass article 190 has a substantially circular cross-section). In such embodiments, the length of the glass substrate is the diameter of a wafer. Such wafer-shaped substrates may have large aspect ratios and be susceptible to increased warp and/or bow when AR coatings 120 are applied.

Unless otherwise defined, all technical and scientific terms used herein have the same meaning as commonly understood by one of ordinary skill in the art to which the embodiments described herein belong. The terminology used in the description herein is for describing particular embodiments only and is not intended to be limiting. As used in the specification and appended claims, the singular forms "a," "an," and "the" are intended to include the plural forms as well, unless the context clearly indicates otherwise.

Unless otherwise indicated, all numbers expressing quantities of ingredients, properties such as substrate dimension, application conditions, and so forth as used in the specification and claims are to be understood as being modified in all instances by the term "about." Accordingly, unless otherwise indicated, the numerical properties set forth in the specification and claims are approximations that may vary depending on the desired properties sought to be obtained in the embodiments described herein. Notwithstanding that the numerical ranges and parameters setting forth the broad scope of the embodiments are approximations, the numerical values set forth in the specific examples are reported as precisely as possible. One of ordinary skill in the art will understand that any numerical values inherently contain certain errors attributable to the measurement techniques used to ascertain the values.

EXAMPLES

Various embodiments will be further clarified by the following examples. In each example the wafers are cleaned before an AR coating is applied. First, the wafers were cleaned in about 10 ppm ozone in deionized water at ambient temperature for 10 minutes. Next, the wafers were cleaned using an ammonia, hydrogen peroxide, and deionized water solution (at a 1:20:40 ratio) at 60° C. for 10 minutes in 1600 watt megasonics. Finally, the wafers were placed in a quick dump rinse bath and dried at ambient temperature.

After the cleaning procedure, the AR coatings were applied using DC pulsed magnetron sputtering. The coated glass articles were then cleaned again using the same cleaning procedure described herein.

Example 1

In one or more embodiments, candidate AR coating materials were applied to glass and Si wafers having a length of 150 mm at various pressures and temperatures to determine the stresses associated with the AR coating materials. Table 1 shows the resulting bow of the coated articles at an application temperature of 200° C. Table 2 shows the resulting bow of the coated articles at an application temperature of 100° C.

TABLE 1

| | Bow (in microns) | | | |
|---|---|---|---|---|
| Material | $SiO_2$ (at about 0.003 torr) | $Nb_2O_5$ (at about 0.006 torr) | $Si_3N_4$ (at about 0.003 torr) | $Si_3N_4$ (at about 0.006 torr) |
| glass | 53.1 | −1.5 | 35 | 0.4 |
| Si | 28.8 | −19.7 | 20 | −23.9 |

TABLE 2

| | Bow (in microns) | | | |
|---|---|---|---|---|
| Material | $SiO_2$ (at about 0.003 torr) | $Nb_2O_5$ (at about 0.006 torr) | $Si_3N_4$ (at about 0.003 torr) | $Si_3N_4$ (at about 0.006 torr) |
| glass | 46 | −13.4 | 30 | −37 |
| Si | 31 | −18.9 | 9.9 | −54 |

Example 2A

A coating of Table 3a was applied at a pressure of about 0.006 torr to 18 wafer shaped glass substrates at 200° C.

TABLE 3a

| Material | Refractive Index | Thickness (t) (in nm) | Film Stress ($\alpha$) (in MPa) |
|---|---|---|---|
| glass | 1.8 | N/A | N/A |
| $Nb_2O_5$ | 2.34 | 18.8 | 8 |
| $SiO_2$ | 1.46 | 18.2 | −127 |
| $Nb_2O_5$ | 2.34 | 73.6 | 8 |
| $SiO_2$ | 1.46 | 9.0 | −127 |
| $Nb_2O_5$ | 2.34 | 33.8 | 8 |
| $SiO_2$ | 1.46 | 93.2 | −127 |

Figure 6A:
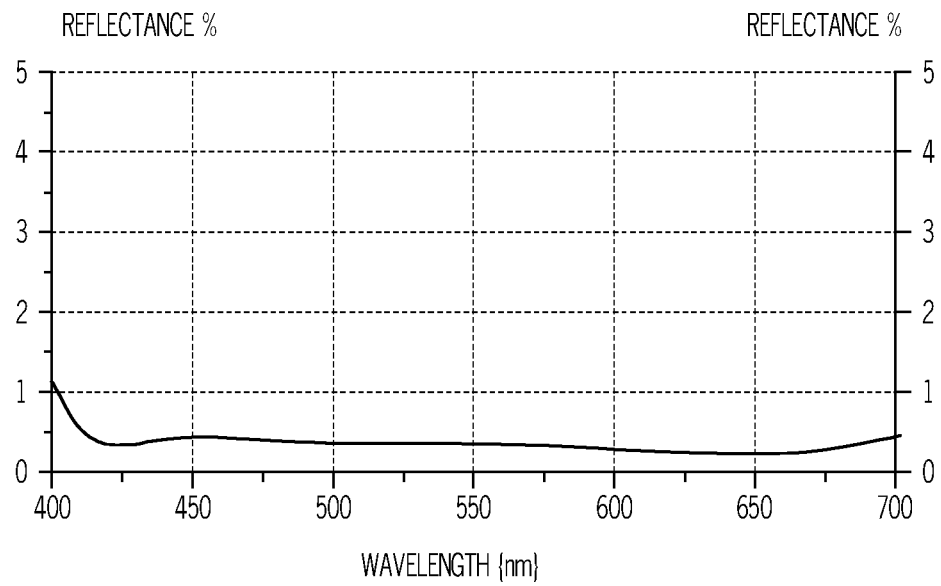
FIG. 6a depicts a graph of reflectance as a function of wavelength for the coated glass substrate of Example 2a, as viewed at a normal angle of incidence, according to one or more embodiments described herein.

FIG. 6a depicts a graph of reflectance as a function of wavelength for the coated glass article of Example 2a, as viewed at a normal angle of incidence. As can be seen from FIG. 6a, the reflectance over the visible spectrum is relatively low.

Example 2B

A coating of Table 3b was applied at a pressure of about 0.006 torr to 8 wafer shaped glass substrates at 200° C.

TABLE 3a

| Material | Refractive Index | Thickness (t) (in nm) | Film Stress ($\alpha$) (in MPa) |
|---|---|---|---|
| glass | 1.8 | N/A | N/A |
| $Nb_2O_5$ | 2.34 | 24.2 | 8 |
| $SiO_2$ | 1.46 | 17.8 | −127 |
| $Nb_2O_5$ | 2.34 | 63.5 | 8 |
| $SiO_2$ | 1.46 | 13.6 | −127 |
| $Nb_2O_5$ | 2.34 | 36.9 | 8 |
| $SiO_2$ | 1.46 | 103.0 | −127 |

Figure 6B:
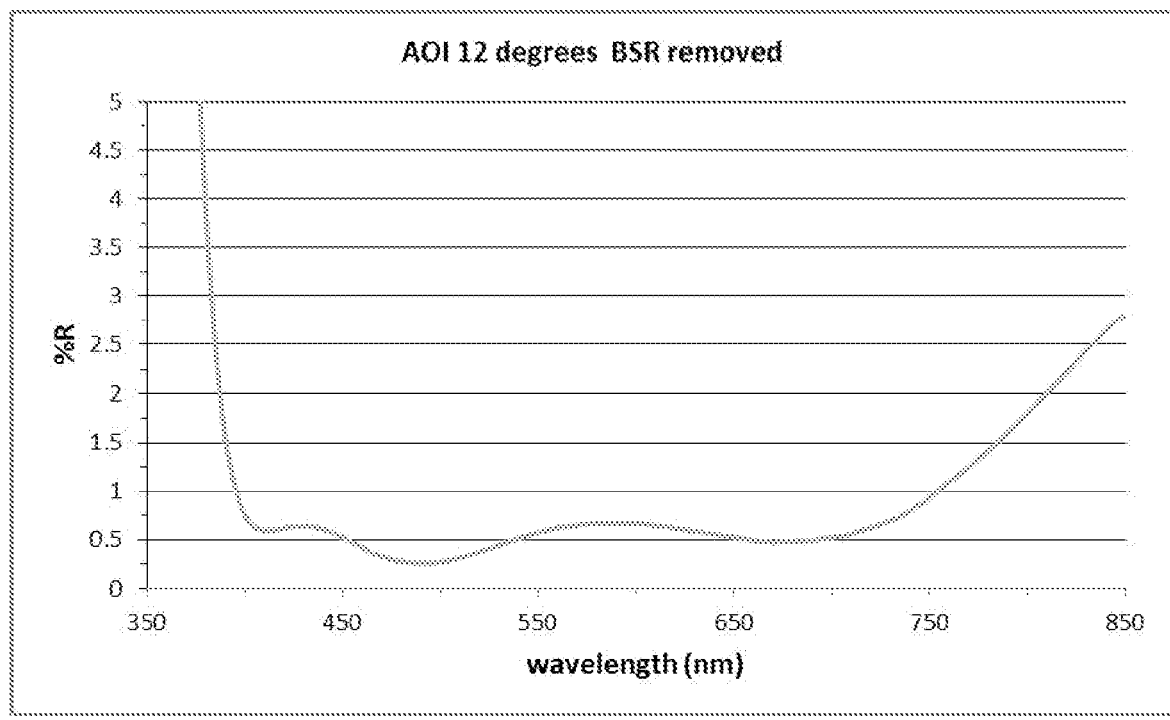
FIG. 6b depicts a graph of reflectance as a function of wavelength for the coated glass substrate of Example 2b, as viewed at a normal angle of incidence, according to one or more embodiments described herein.

FIG. 6b depicts a graph of reflectance as a function of wavelength for the coated glass article of Example 2b, as viewed at a normal angle of incidence. As can be seen from FIG. 6b, the reflectance over the visible spectrum is relatively low.

Example 3

A coating depicted in Table 3 was applied at a pressure of about 0.006 torr to wafer shaped glass substrates at 100° C.

Example 4

A coating depicted in Table 4 was applied at pressure of about 0.003 torr to 9 wafer shaped glass substrates at 100° C.

TABLE 4

| Material | Refractive Index | Thickness (t) (in nm) | Film Stress ($\alpha$) (in MPa) |
|---|---|---|---|
| glass | 1.8 | N/A | N/A |
| $SiO_2$ | 1.46 | 14.3 | −100 |
| $Nb_2O_5$ | 2.34 | 21.9 | 35 |
| $SiO_2$ | 1.46 | 15.4 | −100 |
| $Si_3N_4$ | 2.03 | 91 | 130 |
| $SiO_2$ | 1.46 | 97 | −100 |

Example 5

A coating depicted in Table 4 was applied at a pressure of about 0.006 torr to 8 wafer shaped glass substrates at 100° C.

Figure 7:
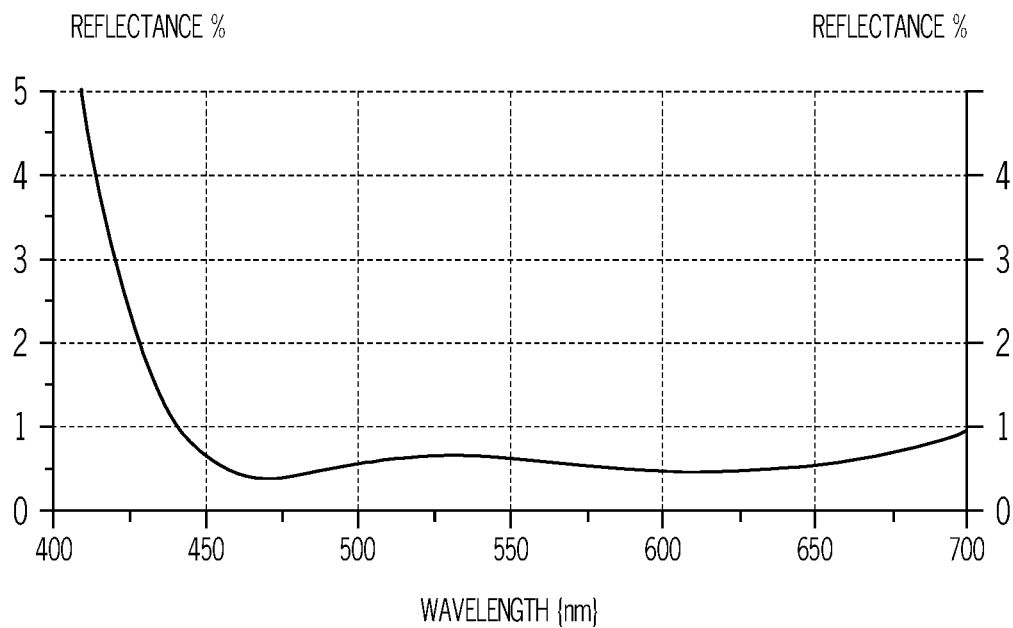
FIG. 7 depicts a graph of reflectance as a function of wavelength for the coated glass substrate of Example 5, as viewed at a normal angle of incidence, according to one or more embodiments described herein.

FIG. 7 depicts a graph of reflectance as a function of wavelength for the coated glass article of Example 5, as viewed at a normal angle of incidence. As can be seen from FIG. 7, the reflectance over the visible spectrum is relatively low.

Example 6—Analysis

Bow and warp were measured before and after coating for Example 2a. The bow and warp data for Example 2a are reproduced in Table 5a.

TABLE 5a

| Sample No. | Bow Before Coating (in microns) | Warp Before Coating (in microns) | Bow After Coating (in microns) | Warp After Coating (in microns) |
|---|---|---|---|---|
| 1a | −0.36689 | 12.08140471 | −6.27891 | 17.03370401 |
| 2a | −1.41965 | 10.86075664 | −13.6257 | 27.20190811 |
| 3a | −0.19524 | 13.39402445 | −8.57059 | 20.87957848 |
| 4a | 0.75377 | 16.19711121 | −7.19875 | 23.85996508 |
| 5a | 0.73127 | 14.88969589 | −3.78831 | 19.85425939 |
| 6a | 1.36711 | 15.25193121 | −6.87095 | 24.91623236 |
| 7a | −0.96276 | 11.47170852 | −7.84169 | 20.55607102 |
| 8a | 0.3973 | 11.56734002 | −11.0053 | 23.03472391 |
| 9a | 0.99849 | 10.42161295 | −3.98041 | 23.32138351 |
| 10a | −0.8683 | 21.25462434 | −14.0589 | 29.73023169 |
| 11a | −1.01162 | 12.93796116 | −8.78771 | 21.20223379 |

TABLE 5a-continued

| Sample No. | Bow Before Coating (in microns) | Warp Before Coating (in microns) | Bow After Coating (in microns) | Warp After Coating (in microns) |
|---|---|---|---|---|
| 12a | −6.2049 | 13.73131165 | −16.0894 | 28.92689132 |
| 13a | 4.57856 | 16.11711695 | −3.2953 | 15.15245597 |
| 14a | −2.78559 | 10.94794198 | −16.4634 | 25.79629432 |
| 15a | 4.71584 | 12.83375156 | −3.843 | 21.47253479 |
| 16a | −9.03368 | 22.66543817 | −21.5832 | 33.31327758 |
| 17a | −5.59372 | 16.13662538 | −15.3799 | 29.0979902 |
| 18a | 1.81027 | 17.91608129 | −3.87754 | 19.19288677 |

Bow and warp were measured before and after coating for Example 2b. The bow and warp data for Example 2b are reproduced in Table 5b.

TABLE 5b

| Sample No. | Bow Before Coating (in microns) | Warp Before Coating (in microns) | Bow After Coating (in microns) | Warp After Coating (in microns) |
|---|---|---|---|---|
| 1b | 4.81948 | 20.19932 | 1.42119 | 11.52936 |
| 2b | 2.614785 | 22.42646 | 1.2681 | 15.89566 |
| 3b | 0.97318 | 19.59231 | 2.370035 | 13.69082 |
| 4b | 2.77509 | 22.38988 | 2.26692 | 16.01686 |
| 5b | 0.475295 | 20.66816 | 2.76154 | 13.02669 |
| 6b | 3.26729 | 20.80196 | 5.730445 | 14.87084 |
| 7b | 0.83852 | 30.47873 | 3.631755 | 18.09607 |
| 8b | 1.72924 | 17.70843 | 1.68439 | 15.27613 |

Bow and warp data were measured before and after coating for Example 4. The bow and warp data are reproduced in Table 6.

TABLE 6

| Sample No. | Bow Before Coating (in microns) | Warp Before Coating (in microns) | Bow After Coating (in microns) | Warp After Coating (in microns) |
|---|---|---|---|---|
| 19 | 0.90916 | 17.75737564 | 50.08 | 55.027 |
| 20 | −0.70143 | 14.80949267 | 51.519 | 58.26 |
| 21 | 1.54821 | 17.56153428 | 51.493 | 63.39 |
| 22 | −0.37971 | 16.7584298 | 51.777 | 65.522 |
| 23 | 3.15503 | 18.73947894 | 64.84 | 78.499 |
| 24 | 0.65728 | 16.06599342 | 41.819 | 48.54 |
| 25 | 1.10353 | 19.72547989 | 46.087 | 60.351 |
| 26 | 1.42733 | 13.58356184 | 45.297 | 51.947 |
| 27 | 3.37384 | 15.12871095 | 46.367 | 55.662 |

Bow and warp data were measured before and after coating for Example 5. The bow and warp data are reproduced in Table 7.

TABLE 7

| Sample No. | Bow Before Coating (in microns) | Warp Before Coating (in microns) | Bow After Coating (in microns) | Warp After Coating (in microns) |
|---|---|---|---|---|
| 28 | −3.51435 | 16.64535535 | −4.836 | 9.953 |
| 29 | 3.18935 | 20.13965045 | 35.778 | 36.978 |
| 30 | 5.92778 | 12.48535062 | 37.757 | 42.849 |
| 31 | 2.76901 | 16.09120199 | 23.092 | 27.1 |
| 32 | 0.44988 | 14.38125433 | 16.538 | 20.938 |
| 33 | −1.01484 | 15.18723528 | 8.318 | 13.679 |
| 34 | −3.33201 | 15.10271696 | 8.659 | 64.546 |
| 35 | 0.23072 | 16.09991027 | 11.873 | 16.354 |

The bow and warp data for Example 2a, 2b, 4, and 5 were averaged to show the mean effect of the AR coating on the bow and warp of the coated glass article.

TABLE 8

| | Mean Bow Before Coating (in microns) | Mean Warp Before Coating (in microns) | Mean Bow After Coating (in microns) | Mean Warp After Coating (in microns) | Mean Change in Bow (in microns) | Mean Change in Warp (in microns) |
|---|---|---|---|---|---|---|
| Example 2a | −0.727 | 14.482 | −9.585 | 23.586 | −8.858 | 9.104 |
| Example 2b | 2.186 | 21.783 | 2.641 | 14.800 | 0.4551 | −6.982 |
| Example 4 | 1.233 | 16.681 | 49.920 | 59.689 | 48.687 | 43.008 |
| Example 5 | 0.588 | 15.767 | 17.147 | 29.050 | 16.559 | 13.283 |

The film stresses and layer thicknesses of Examples 2a, 2b, 3 and 4 were inserted into Eq. (3) to determine the cumulative layer stresses. The absolute values for these cumulative layer stresses are listed in Table 9.

TABLE 9

| | Absolute Value of Cumulative Layer Stress (in MPa nm) |
|---|---|
| Example 2a | 14281 |
| Example 2b | 16072 |
| Example 3 | 7623 |
| Example 4 | 73.5 |

What is claimed is:

1. A coated glass article comprising:
a glass substrate comprising a first major surface, a second major surface opposite the first major surface, and a substrate thickness measured between the first major surface and the second major surface, the glass substrate having an aspect ratio of at least 250:1;
an anti-reflective coating comprising alternating layers of high refractive index materials and low refractive index materials, each layer comprising a layer thickness (t) and a film stress ($\alpha$), wherein a cumulative layer stress of the anti-reflective coating has an absolute value less than or equal to about 167,000 MPa nm, wherein the cumulative layer stress is defined as $\Sigma_{i=1}^{n}(\alpha_i \times t_i)$ for an anti-reflective coating comprising n layers; and
wherein:
the anti-reflective coating comprises from 4 to 18 layers;
the anti-reflective coating comprises materials selected from the group consisting of $SiO_2$, $Al_2O_3$, $GeO_2$, SiO, $AlO_xN_y$, AlN, SiNx, $SiO_xN_y$, $Si_uAl_yO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YbF_xO_y$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, and polymethylmethacrylate;
the coated glass article having a reflectance of less than or equal to about 2% for all wavelengths from 450 nm to 700 nm when viewed on the first major surface at an angle of incidence of less than or equal to about 10°; and
the coated glass article has a bow of from about −100 microns to 100 microns.

2. The coated glass article of claim 1, wherein the cumulative layer stress of the anti-reflective coating has an absolute value less than or equal to about 125,000 MPa nm.

3. The coated glass article of claim 1, wherein the cumulative layer stress of the anti-reflective coating has an absolute value less than or equal to about 75,000 MPa nm.

4. The coated glass article of claim 1, wherein the cumulative layer stress of the anti-reflective coating has an absolute value less than or equal to about 25,000 MPa nm.

5. The coated glass article of claim 1, wherein each layer has a layer thickness from about 1.5 nm to about 150 nm.

6. The coated glass article of claim 1, wherein the anti-reflective coating has a thickness of less than or equal to about 500 nm.

7. The coated glass article of claim 1, wherein the glass substrate has a refractive index of from about 1.5 to about 2.0.

8. The coated glass article of claim 1, wherein the coated glass article has a warp of less than or equal to about 150 microns.

9. The coated glass article of claim 1, wherein the coated glass article comprises an air-side surface and a surface roughness ($R_a$) of the air-side surface of the coated glass article is less than or equal to about 2 nm.

10. The coated glass article of claim 1, wherein the glass substrate is wafer shaped.

11. The coated glass article of claim 1, wherein the glass substrate has an aspect ratio of at least 500:1.

12. The coated glass article of claim 1, wherein the glass substrate has an aspect ratio of at least 750:1.

13. The coated glass article of claim 1, wherein the glass substrate has an aspect ratio of at least 1,000:1.

* * * * *